United States Patent
Ananthaswamy

(10) Patent No.: US 7,477,170 B2
(45) Date of Patent: Jan. 13, 2009

(54) SAMPLE RATE CONVERTER SYSTEM AND METHOD

(75) Inventor: Ganesh Ananthaswamy, North Andover, MA (US)

(73) Assignee: Analaog Devices, Inc., Norwood, MA (US)

( * ) Notice: Subject to any disclaimer, the term of this patent is extended or adjusted under 35 U.S.C. 154(b) by 58 days.

(21) Appl. No.: 11/801,523

(22) Filed: May 9, 2007

(65) Prior Publication Data

US 2008/0279319 A1    Nov. 13, 2008

(51) Int. Cl.
*H03M 7/00* (2006.01)

(52) U.S. Cl. .......................... 341/61; 341/122; 341/123; 341/124; 341/125; 375/222; 375/232; 375/344; 375/350; 375/371

(58) Field of Classification Search .................. 341/61, 341/122–125; 375/222, 232, 344, 350, 371, 375/372

See application file for complete search history.

(56) References Cited

U.S. PATENT DOCUMENTS

| | | | | |
|---|---|---|---|---|
| 5,528,308 | A * | 6/1996 | Alelyunas et al. | 348/512 |
| 5,537,435 | A * | 7/1996 | Carney et al. | 375/219 |
| 6,028,542 | A * | 2/2000 | Fukui et al. | 341/123 |
| 6,215,423 | B1 * | 4/2001 | May et al. | 341/61 |
| 6,381,265 | B1 * | 4/2002 | Hessel et al. | 375/219 |
| 6,396,421 | B1 * | 5/2002 | Bland | 341/61 |
| 6,421,636 | B1 * | 7/2002 | Cooper et al. | 704/205 |
| 6,462,682 | B2 * | 10/2002 | Hellberg | 341/61 |
| 6,509,850 | B1 * | 1/2003 | Bland | 341/61 |
| 6,563,448 | B1 * | 5/2003 | Fontaine | 341/143 |
| 6,573,940 | B1 * | 6/2003 | Yang | 348/441 |
| 6,636,165 | B2 * | 10/2003 | Freidhof | 341/61 |
| 6,661,357 | B2 * | 12/2003 | Bland | 341/61 |
| 6,707,868 | B1 * | 3/2004 | Camagna et al. | 375/371 |
| 6,952,461 | B2 * | 10/2005 | Yasuda et al. | 375/372 |
| 6,961,314 | B1 * | 11/2005 | Quigley et al. | 370/252 |
| 6,970,511 | B1 * | 11/2005 | Barnette | 375/240.21 |
| 7,129,868 | B2 * | 10/2006 | Ku | 341/122 |

(Continued)

OTHER PUBLICATIONS

Floyd M. Gardner, Interpolation in Digital Modems—Part I: Fundamentals, 1993, IEEE 0278-0062/93, vol. 41, No. 6, pp. 501-507.

(Continued)

*Primary Examiner*—Linh V Nguyen
(74) *Attorney, Agent, or Firm*—Iandiorio Teska & Coleman

(57) ABSTRACT

A sample rate conversion is accomplished by presenting to a numerically controlled oscillator (NCO) register a clock input at the desired output rate; first-modifying the NCO register contents responsive to a first factor; determining when the first modified NCO register contents are in a predetermined range and in response to the first modified NCO register contents not being in the predetermined range, presenting the first modified NCO register contents to the input of the NCO register; second-modifying, responsive to a second factor, the first modified NCO register contents when the first modified NCO register contents are within the predetermined range and presenting it to the input of the NCO register; and fetching samples, in response to the first-modified NCO register contents being in the predetermined range and interpolating them to produce a resultant sample value at the output rate, and in response to the contents not being in the predetermined range to interpolate the previous sample to produce a resultant sample value at the output rate.

36 Claims, 9 Drawing Sheets

U.S. PATENT DOCUMENTS

| | | | |
|---|---|---|---|
| 7,227,477 B2 * | 6/2007 | Ye | 341/61 |
| 7,298,296 B1 * | 11/2007 | Kamath et al. | 341/61 |
| 7,352,303 B1 * | 4/2008 | Duewer et al. | 341/61 |
| 2001/0045901 A1 * | 11/2001 | Auerbach et al. | 341/123 |
| 2006/0290543 A1 * | 12/2006 | Ye | 341/61 |
| 2008/0056403 A1 * | 3/2008 | Wilson | 375/268 |

OTHER PUBLICATIONS

Lars Erup et al., Interpolation in Digital Modems—Part II: Implementation and Performance, 1993, IEEE, 0090-6778/93, vol. 41, No. 3, pp. 998-10083.

* cited by examiner

SAMPLE RATE CONVERTER SYSTEM AND METHOD

FIELD OF THE INVENTION

This invention relates to an improved sample rate converter system and method.

BACKGROUND OF THE INVENTION

Sample rate converters generally receive samples at a first rate, e.g., $f_{band}$, up sample to a higher than desired rate, then down sample to the final rate, e.g. the input rate of a digital to analog converter. These devices employ a clock at the input rate to decrement the control word for a numerically controlled oscillator (NCO) to generate a new output sample each time the decremented NCO control word reaches zero or below i.e. underflows. Alternatively, the control word can be incremented and an output generated each time the NCO control word overflows. However, these approaches have shortcomings. There can be a frequency error when the desired conversion rate cannot be accurately represented with the available number of bits. There can be output timing jitter because the output samples can only be provided at the NCO clock rate.

BRIEF SUMMARY OF THE INVENTION

It is therefore an object of this invention to provide an improved sample rate converter system and method.

It is a further object of this invention to provide an improved sample rate converter system and method which avoids frequency error.

It is a further object of this invention to provide an improved sample rate converter system and method which avoids timing jitter.

It is a further object of this invention to provide an improved sample rate converter system and method which uses an input clock running at the output rate.

The invention results from the realization that an improved sample rate conversion can be effected with reduced jitter and improved accuracy by presenting to a numerically controlled oscillator (NCO) register a clock input at the desired output rate; first-modifying the NCO register contents responsive to a first factor; determining when the first modified NCO register contents are in a predetermined range; second-modifying, responsive to a second factor, the first modified NCO register contents when the first modified NCO register contents are within the predetermined range and presenting it to the input of the NCO register; and fetching samples, in response to the first-modified NCO register contents being in the predetermined range and interpolating them to produce a resultant sample value at the output rate, and in response to the contents not being in the predetermined range to interpolate the previous sample to produce a resultant sample value at the output rate and presenting the first modified NCO register contents to the input of the NCO register.

The subject invention, however, in other embodiments, need not achieve all these objectives and the claims hereof should not be limited to structures or methods capable of achieving these objectives.

This invention features a sample rate converter system including a numerically controlled oscillator (NCO) register for receiving a clock input at the desired output rate, a first summing circuit, responsive to a first factor to decrement the NCO register contents and a comparator for indicating when the decremented NCO register contents are at zero or below and in response to the decremented NCO register contents not being zero or below may present the decremented NCO register contents to the input of the NCO register. A second summing circuit responds to the decremented NCO register contents being zero or below to increment the decremented NCO register contents by a second factor and present it to the input of the NCO register. A processor is configured, in response to the decremented NCO register contents being zero or below, to fetch samples and interpolate them to produce a resultant sample value at the output rate, and in response to the contents not being zero or below to interpolate the previous sample to produce a resultant sample value and present the decremented register contents to the input of the NCO register.

In a preferred embodiment the ratio of the first and second factors may be the ratio of the input rate, to twice the output rate of the sample rate converter system. The ratio of the first and second factors may be between 0.5 and 1.0. The second factor may be one and the first factor may be $1/\beta$, where $\beta$ may be twice the rate conversion factor and where the rate conversion factor may be the ratio of the output rate to the input rate. The processor may be further configured to interpolate, in response to the decremented NCO register contents being zero or below, the fetched samples by determining which of two sample patterns exist, setting the normalized distance and indexing the location of the previous sample value relative to other samples in a buffer for the determined sample pattern and from the normalized distance and at least two of the sample values in the buffer to calculate the interpolated sample value. The processor may be further configured, in response to the decremented NCO register contents being not zero or below, to set the normalized distance and index the location of the previous sample value relative to other sample values in a buffer and from the normalized distance and at least two sample values in the buffer, calculate the interpolated sample value.

This invention also features a sample rate converter system including a numerically controlled oscillator (NCO) register for receiving a clock input at the desired output rate, a first summing circuit, responsive to a first factor to increment the NCO register contents and a comparator for indicating when the incremented NCO register contents are at one or above and in response to the incremented NCO register contents not being one or above, may present the incremented NCO register contents to the input of the NCO register. A second summing circuit responds to the incremented NCO register contents being one or above to decrement the incremented NCO register contents by a second factor and present it to the input of the NCO register. A processor is configured, in response to the incremented NCO register contents being one or above, to fetch samples and interpolate them to produce a resultant sample value at the output rate, and in response to the contents not being one or above to interpolate the previous sample to produce a resultant sample value.

In a preferred embodiment the ratio of the first and second factors may be the ratio of the input rate, to twice the output rate of the sample rate converter system. The ratio of the first and second factors may be between 0.5 and 1.0. The second factor may be one and the first factor may be $1/\beta$, where $\beta$ may be twice the rate conversion factor and where the rate conversion factor may be the ratio of the output rate to the input rate. The processor may be further configured to interpolate, in response to the incremented NCO register contents being one or above the fetched samples by determining which of two sample patterns exist, setting the normalized distance and indexing the location of the previous sample value relative to other samples in a buffer for the determined sample pattern and from the normalized distance and at least two of the sample values in the buffer to calculate the interpolated sample value. The processor may be further configured, in response to the incremented NCO register contents being not one or above, to set the normalized distance and index the location of the previous sample value relative to other sample values in a buffer and from the normalized distance and at least two sample values in the buffer, calculate the interpolated sample value.

This invention also features a sample rate converter system including a numerically controlled oscillator (NCO) register for receiving a clock input at the desired output rate, a first summing circuit, responsive to a first factor to first modify the NCO register contents and a comparator for indicating when the first modified NCO register contents are in a predetermined range and in response to the first modified NCO register contents not being in the predetermined range may present the first modified NCO register contents to the input of the NCO register. A second summing circuit responds to the first modified NCO register contents being in the predetermined range to second modify the first modified NCO register contents by a second factor and present it to the input of the NCO register. A processor is configured, in response to the first modified NCO register contents being in the predetermined range, to fetch samples and interpolate them to produce a resultant sample value at the output rate, and in response to the contents not being in the predetermined range to interpolate the previous sample to produce a resultant sample value.

In a preferred embodiment the ratio of the first and second factors may be the ratio of the input rate, to twice the output rate of the sample rate converter system. The ratio of the first and second factors may be between 0.5 and 1.0. The second factor may be one and the first factor may be $1/\beta$, where $\beta$ may be twice the rate conversion factor and where the rate conversion factor may be the ratio of the output rate to the input rate. The processor may be further configured to interpolate, in response to the first modified NCO register contents being in the predetermined range, the fetched samples by determining which of two sample patterns exist, setting the normalized distance and indexing the location of the previous sample value relative to other samples in a buffer for the determined sample pattern and from the normalized distance and at least two of the sample values in the buffer to calculate the interpolated sample value. The processor may be further configured, in response to the first modified NCO register contents being not in the predetermined range, to set the normalized distance and index the location of the previous sample value relative to other sample values in a buffer and from the normalized distance and at least two sample values in the buffer, calculate the interpolated sample value.

This invention also features a sample rate converter method including presenting to a numerically controlled oscillator (NCO) register a clock input at the desired output rate, first-modifying the NCO register contents responsive to a first factor, determining when the first modified NCO register contents are in a predetermined range and in response to the first-modified NCO register contents not being in the predetermined range may present the first modified NCO register contents to the input of the NCO register. There is a second-modifying, responsive to a second factor, of the first modified NCO register contents when the first modified NCO register contents are within the predetermined range and a presentation of it to the input of the NCO register. In response to the first-modified NCO register contents being in the predetermined range samples are fetched and interpolated to produce a resultant sample value at the output rate. In response to the contents not being in the predetermined range the previous sample is interpolated to produce a resultant sample value at the output rate.

In a preferred embodiment the ratio of the first and second factors may be twice the ratio of the input rate, to the output rate of the sample rate converter system. The ratio of the first and second factors may be between 0.5 and 1.0. The second factor may be one and the first factor may be $1/\beta$, where $\beta$ may be twice the rate conversion factor and where the rate conversion factor may be the ratio of the output rate to the input rate. Interpolating may include in response to the first modified NCO register contents being in the predetermined range, determining which of two sample patterns exist, setting the normalized distance and indexing the location of the previous sample value relative to other samples in a buffer for the determined sample pattern and from the normalized distance and at least two of the sample values in the buffer to calculating the interpolated sample value. Interpolating, in response to the first modified NCO register contents being not in the predetermined range may include setting the normalized distance and indexing the location of the previous sample value relative to other sample values in a buffer and from the normalized distance and at least two sample values in the buffer, calculating the interpolated sample value.

This invention also features a sample rate converter method including presenting to a numerically controlled oscillator (NCO) register a clock input at the desired output rate; decrementing the NCO register contents responsive to a first factor; determining when the decremented NCO register contents are in a predetermined range and in response to the decremented NCO register contents not being in the predetermined range, may present the decremented NCO register contents to the input of the NCO register; incrementing responsive to a second factor, the first decremented NCO register contents when the first decremented NCO register contents are zero or below and presenting it to the input of the NCO register. Samples are fetched, in response to the decremented NCO register contents being zero or below and interpolated to produce a resultant sample value at the output rate. In response to the contents not being zero or below the previous sample is interpolated to produce a resultant sample value at the output rate.

In a preferred embodiment the ratio of the first and second factors may be the ratio of the input rate, to twice the output rate of the sample rate converter system. The ratio of the first and second factors may be between 0.5 and 1.0. The second factor may be one and the first factor may be $1/\beta$, where $\beta$ may be twice the rate conversion factor and where the rate conversion factor may be the ratio of the output rate to the input rate. Interpolating may include in response to the first decremented NCO register contents being zero or below, determining which of two sample patterns exist, setting the normalized distance and indexing the location of the previous sample value relative to other samples in a buffer for the determined sample pattern and from the normalized distance and at least two of the sample values in the buffer to calculating the interpolated sample value. Interpolating, in response to the first decremented NCO register contents being not zero or below may include setting the normalized distance and indexing the location of the previous sample value relative to other sample values in a buffer and from the normalized distance and at least two sample values in the buffer, calculating the interpolated sample value.

This invention also features a sample rate converter method including presenting to a numerically controlled oscillator (NCO) register a clock input at the desired output rate; incrementing the NCO register contents responsive to a first factor;

determining when the incremented NCO register contents are one or above and in response to the incremented NCO register contents not being one or above may present the incremented NCO register contents to the input of the NCO register; decrementing, responsive to a second factor, the first modified NCO register contents when the incremented NCO register contents are one or above and presenting it to the input of the NCO register. Samples are fetched in response to the incremented NCO register contents being one or above and interpolated to produce a resultant sample value at the output rate. In response to the contents not being one or above the previous sample is interpolated to produce a resultant sample value at the output rate.

In a preferred embodiment the ratio of the first and second factors may be the ratio of the input rate, to twice the output rate of the sample rate converter system. The ratio of the first and second factors may be between 0.5 and 1.0. The second factor may be one and the first factor may be $1/\beta$, where $\beta$ may be twice the rate conversion factor and where the rate conversion factor may be the ratio of the output rate to the input rate. Interpolating may include in response to the incremented NCO register contents being one or above, determining which of two sample patterns exist, setting the normalized distance and indexing the location of the previous sample value relative to other samples in a buffer for the determined sample pattern and from the normalized distance and at least two of the sample values in the buffer to calculating the interpolated sample value. Interpolating, in response to the incremented NCO register contents being not one or above, may include setting the normalized distance and indexing the location of the previous sample value relative to other sample values in a buffer and from the normalized distance and at least two sample values in the buffer, calculating the interpolated sample value.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
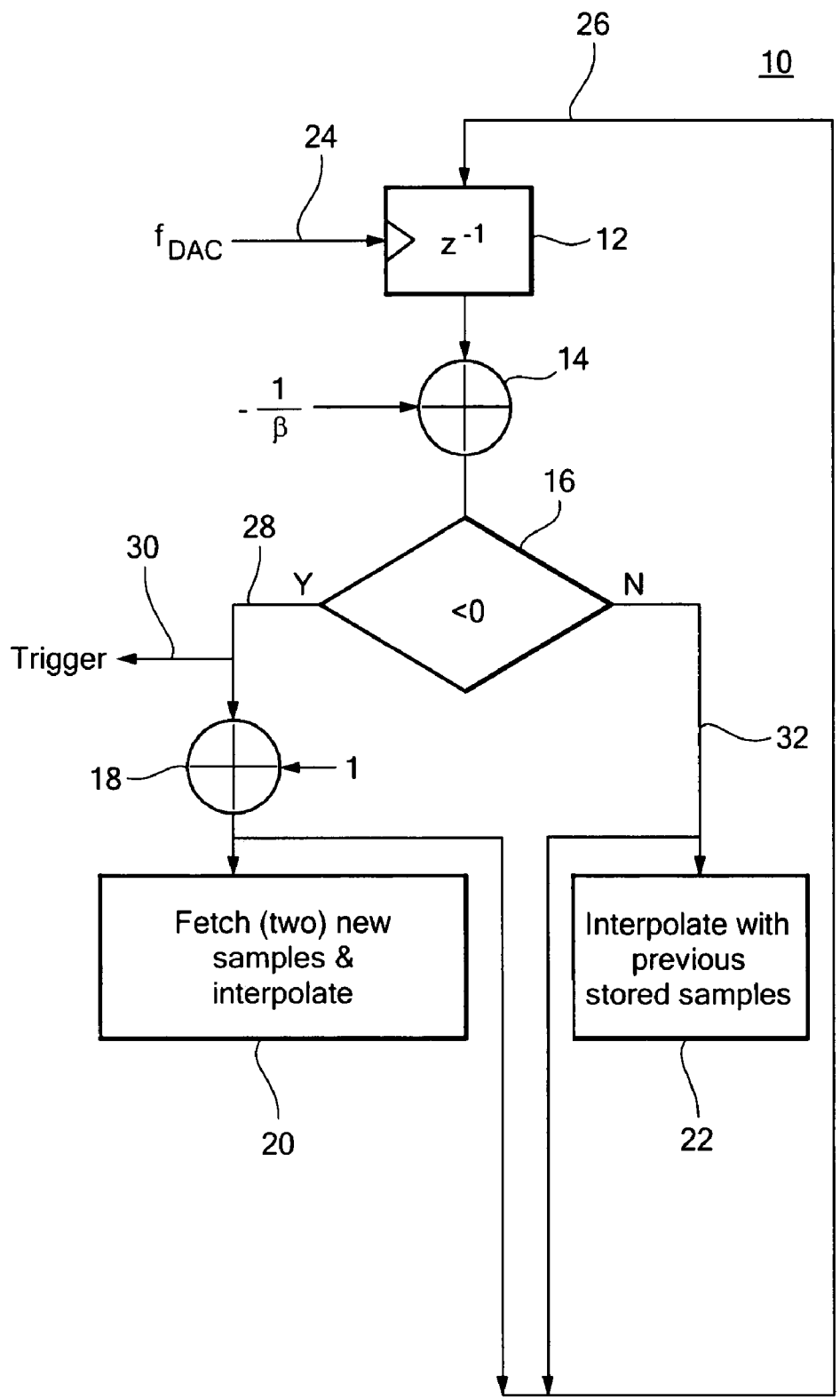
FIG. 1 is a schematic block diagram of a sample rate conversion system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

In conventional sample rate conversion systems the input clock to the sample rate conversion system is at the input sample rate, e.g. $f_{baud}$. The output rate is that rate required by the subsequent components, e.g. $f_{DAC}$ for the sampling rate of the following DAC. This results in the frequency error and timing jitter as explained, supra. This invention avoids those problems by using the output rate as the input clock to the NCO to overcome the jitter. And uses modifying factors which can effectively accomplish division by rational fractions without sacrificing the intrinsic accuracy of which the system is capable. Since the trigger events can only be slower than the NCO clock rate two samples or more need to be fetched in order to insure that the input samples required for interpolation are available.

There is shown in FIG. 1, a sample rate converter 10, according to this invention, including a numerically controlled oscillator (NCO) register 12, summing circuit 14, comparator 16 and summing circuit 18, as well as two interpolation circuits 20 and 22. Interpolator 20 fetches two or more new samples and interpolates with respect to them, while interpolator 22 interpolates with previous stored samples. The method and system of this invention may be implemented fully in an application specific integrated circuit (ASIC), a field programmable gate array (FPGA), a microprocessor such as ARM9, a digital signal processor such as Blackfin, etc.

NCO register 12 receives a clock signal on line 24; conventionally this clock signal is at a much higher rate than the output rate of sample rate converter 10. Typically this input clock runs at the input rate. In contrast in this invention, the input clock at 24 is at the output rate: for example, the frequency of $f_{DAC}$ where the output of sample rate converter system 10 is being used to drive a digital to analog converter (DAC). Data is loaded into NCO register 12 via line 26. The sample rate converter system 10 according to this invention may be either a decrementing, underflow, type or an incrementing, overflow, type. For this particular explanation sample rate converter system 10 is operated as a decrementing, underflow type. Therefore, summer 14 decrements the contents of NCO register 12. It does so by a factor $1/\beta$ often referred to as a control word.

If the decremented contents of NCO register 12 are zero or below, comparator 16 provides an output on line 28 which functions as a trigger signal 30 to trigger the input sample or some other operation. At this time, with the decremented NCO contents being at zero or below, summer 18 adds one to those contents and delivers them to interpolator 20. Interpolator 20 fetches two or more new samples and interpolates with respect to them to determine the value of the output sample. If the decremented contents of NCO register 12 are not zero or below, that is they are above zero, then comparator 16 provides an output on line 32 to interpolator 22 which interpolates with previous stored samples and provides no trigger. When comparator 16 provides an output on line 32 the decremented output of NCO 12 contents are delivered back on line 26 to the input of NCO register 12. When comparator 16 finds that the decremented NCO contents are zero or below the decremented value, plus one (+1) will be returned on line 26 to the input of NCO register 12. Note, that since the input clock on 24 to NCO register 12 is not a typical high rate input sample rate clock, but is rather the output rate ($f_{DAC}$) there is no jitter with respect to the output samples because they occur directly at the sample time.

In the control word +1/β, β is equal to 2r where r is the rate conversion factor and the rate conversion factor is output rate/input rate. In this embodiment r is between 0.5 and 1, therefore, β is between 1 and 2. A specific example will explain the operation. Assume β is 2 and we load NCO register 12 with a 1 and on the first clock cycle summer 14 subtracts 0.5 from the contents of NCO 12 providing a 0.5 to comparator 16. This is larger than zero: an output is provided on line 32 to interpolator 22 and a 0.5 is returned on line 26 to NCO register 12 (interpolation can be done in a number of conventional ways, for example, using the "Farrow structure"). On the next clock cycle the contents 0.5 of NCO register 12 are decremented again by 0.5 in summer 14; the result is now zero. Comparator 16 is now satisfied and provides an output on line 28 producing a trigger on line 30 and causing summing circuit 18 to add a +1 to the zero bringing the ultimate value to 1. Interpolator 20 is now operated and the 1 is returned on line 26 to NCO register 12. On the next clock cycle the 1 is decremented by 0.5 in summer 14 and comparator 16 provides an output on line 32. Thus, every other clock input 24 produces a trigger on line 30 and causes interpolator 20 to fetch two or more new samples with which to interpolate.

Another problem with the prior art beyond jitter is that of accuracy. For example, when −1/β is a rational number like ½ or ¼, the division of input clock 24 can be effected accurately. But if it is not, for example, if β is 1.5, than no matter how large a bit capacity the system may have it can never accurately represent ⅔.

Figure 2:
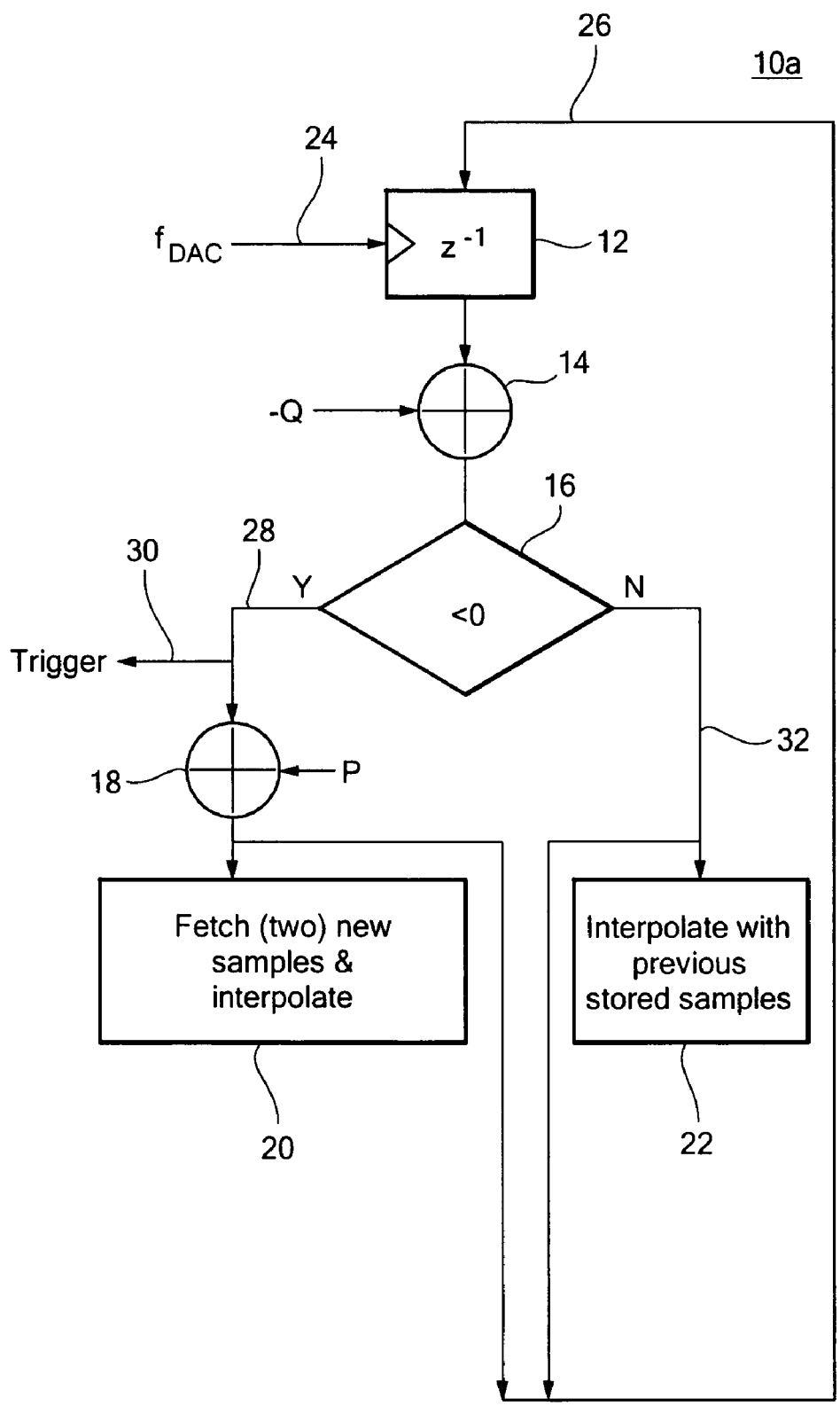
FIG. 2 is a schematic block diagram of a sample rate conversion system according to this invention using selected modifying factors.

To address this problem this invention further modifies the embodiment of FIG. 1. For example, in FIG. 1 the factor to which summer circuit 14 responds is −1/β and the factor to which summer circuit 18 responds is the factor of 1. In accordance with this invention sample rate converter system 10a, FIG. 2, uses a factor −Q with respect to summing circuit 14 and a factor P with respect to summing circuit 18 where β equals P/Q and P/Q like β is between one and two. Also, P and Q each should be between zero and 1. Operation is the same as with respect to converter system 10, FIG. 1, and can perform as an underflow or overflow system.

Figure 3:
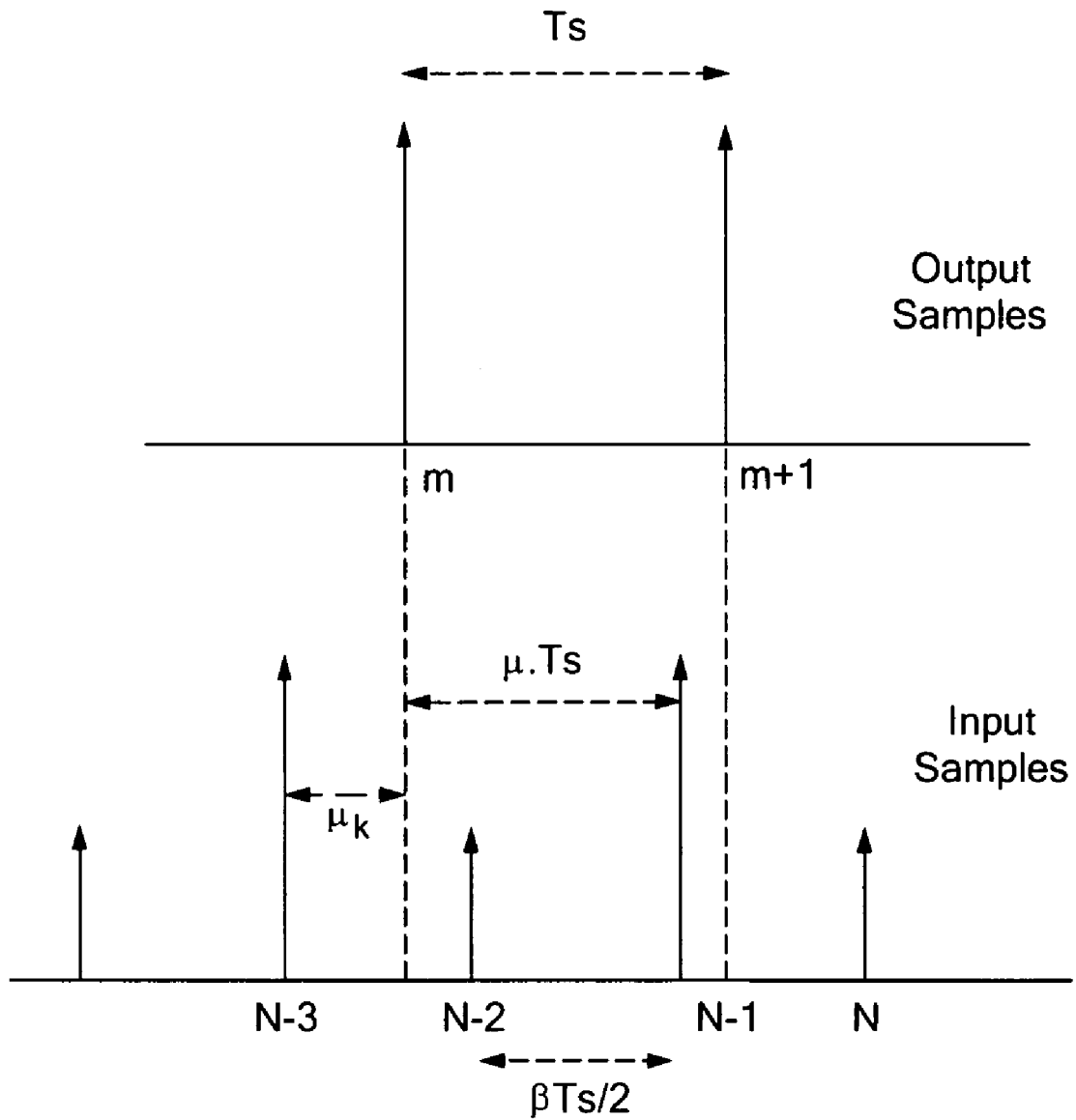
FIG. 3 is an illustration of the relative positions of the output samples and input samples when the output sample is between first and second samples of the previous sample pair, and the NCO triggers.
Figure 4:
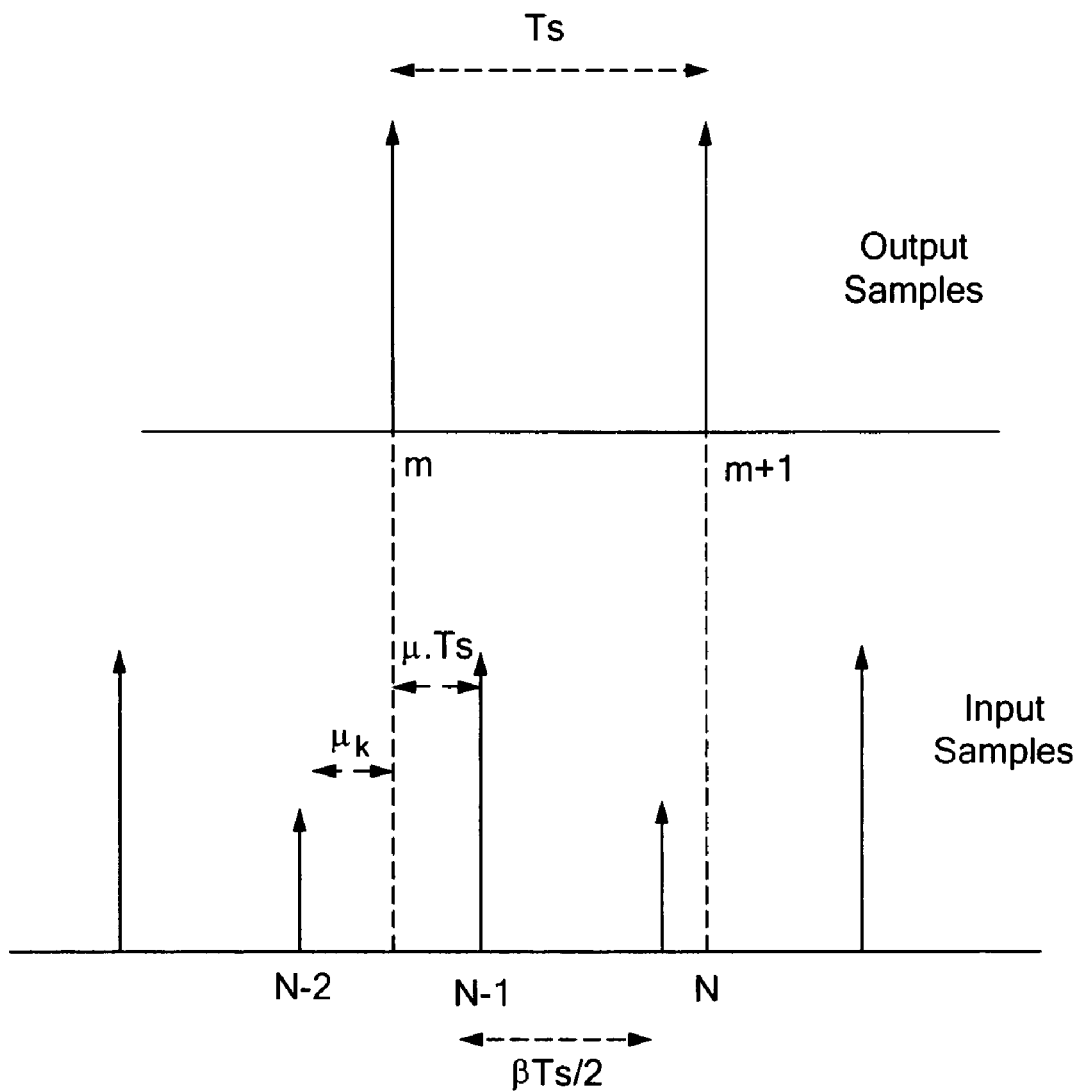
FIG. 4 is an illustration of the relative positions of the output samples and input samples when the output sample is between the second sample of the previous sample pair and the first sample of the next sample pair and the NCO triggers.
Figure 5:
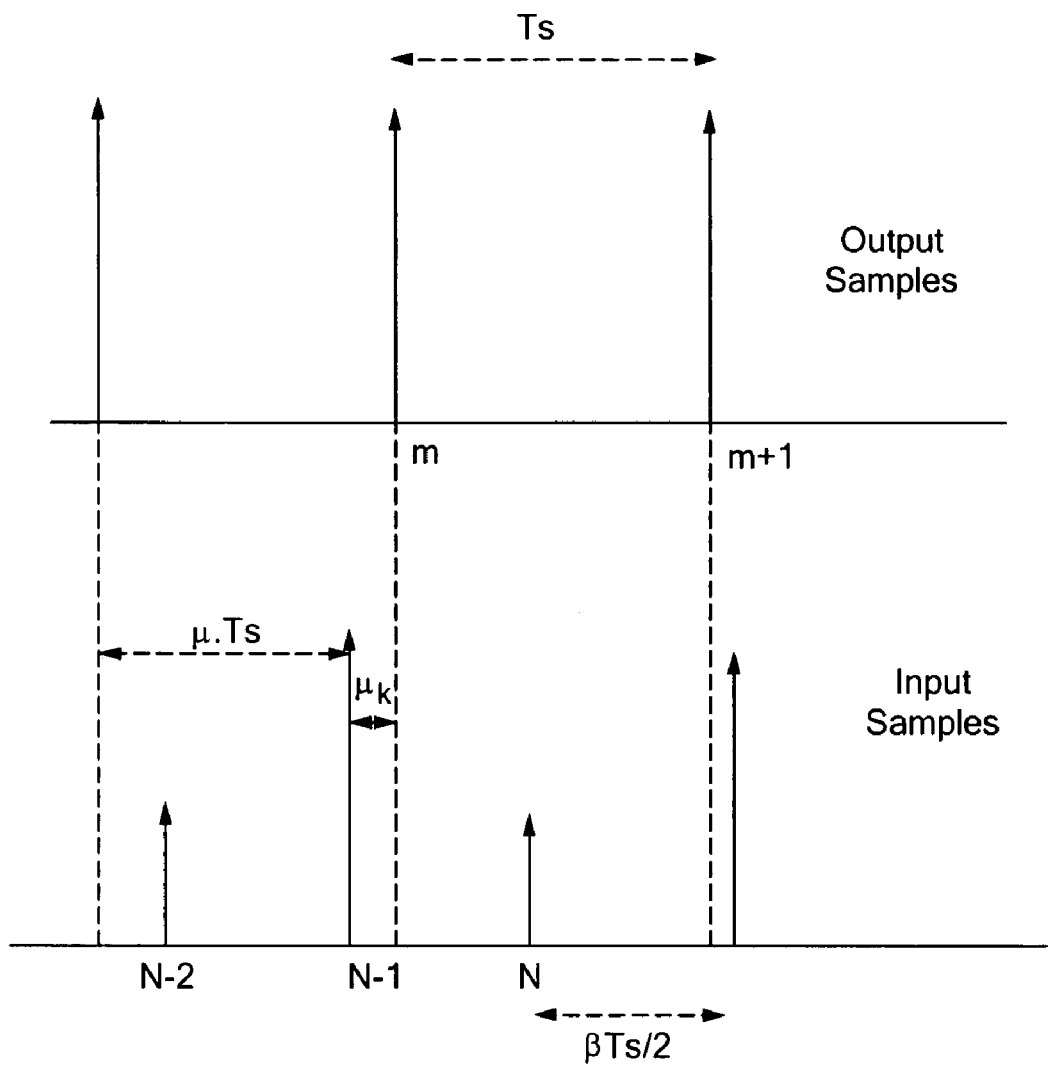
FIG. 5 is an illustration of the relative positions of the output samples and input samples when the output sample is between the first and second samples of the latest pair and the NCO does not trigger.
Figure 6:
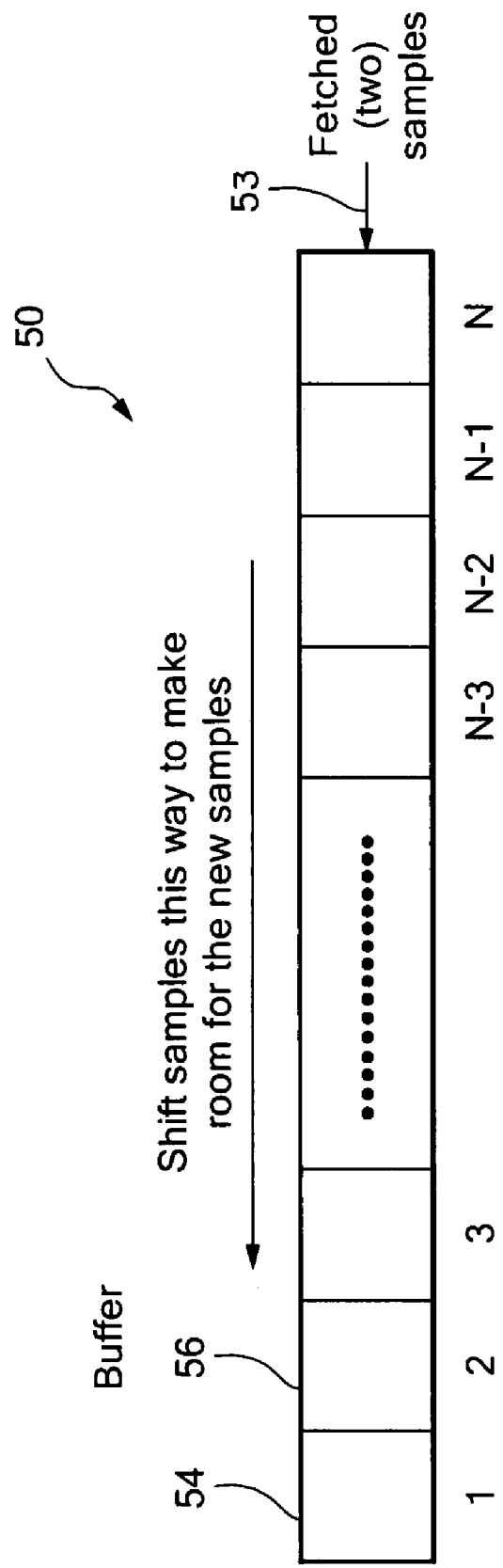
FIG. 6 is a schematic diagram of the storage buffer shift register that holds the samples.

FIGS. 3, 4 and 5 show the three patterns that can occur between the output sample and the input samples. FIG. 3 shows the pattern where the current output sample falls in between the first and second samples of the previously fetched input sample pair. There $\mu_k$ represents the relative distance in time of the current output sample from the previous input sample. FIG. 4 illustrates the case where the current output sample falls in between the second sample of the previously fetched pair of samples and the first sample of the latest fetch pair of samples. There $\mu_k$ represents the relative distance in time of the current output sample from the previous input sample. And FIG. 5 illustrates the pattern where the current output sample falls in between the first and second samples of the latest fetched pair of samples. There $\mu_k$ represents the relative distance in time of the current output sample from the previous input sample. In the patterns of FIGS. 3 and 4 the condition of comparator 16 is met and a trigger is provided. In the pattern of FIG. 5 it is not met and no trigger is provided. In each case a determination is made of $\mu \cdot T_s$ and from that $\mu_k$ is determined; once $\mu_k$ is determined, then one or more of the rest of the samples can be indexed for the purposes of interpolation. For example, an interpolation using the Farrow structure as referred to before. In FIG. 3, the interpolation is between sample N-3 and N-2, in FIG. 4, between N-2 and N-1 and in FIG. 5, between N-1 and N. These samples are stored in a buffer 50, FIG. 6. The fetched (two) samples are introduced at 53 and cause the last two samples 54, 56 to be moved out each time to make way for the new samples. Note that μ(m) and μ are used interchangeably all through the text.

In accordance with this invention let r>0.5 be the sample rate conversion factor and $1/T_s$ define the output sample rate. Define β=2r so that β>1. The input samples of the rate converter have a sample period of $\beta T_s/2$. Set the control word to 1/β so that the NCO triggers at half the input rate. It is assumed that two samples are read into the input buffer when the NCO triggers. It is further assumed that the latest sample is in location N of buffer 50, FIG. 6, and the previous samples are downshifted. There are only two possible scenarios as shown in FIGS. 3 and 4 when the NCO triggers. This is because more than two input samples cannot fall in between any two output samples since β>1. The input sample with the longer stem in the figures represents the first (odd) of the pair of input samples read into the buffer when the NCO triggers. Let the contents of the NCO register 12 at the m'th output sample instant be v(m) and let μ(m)=β·v(m). Then, when the NCO triggers at time m+1, μ(m) represents the distance of the latest odd input sample from the $m^{th}$ output sample as shown in FIG. 3 and FIG. 4. Therefore, the $m^{th}$ output sample falls between the input samples of N-2 and N-1, FIG. 4 or between the N-3 and N-2 input FIG. 3. Given the distances of the various samples in the figures, it is straight forward to compute that $\mu_k=(\beta/2-\mu)T_s$ in FIG. 4 and $\mu_k=(\beta-\mu)T_s$ in FIG. 3. Therefore the linear interpolation of the output sample y between the two input samples with values $S_1$ and $S_2$ (say) are obtained as:

$$y=(1-\mu_k)s_1+\mu_k s_2 \qquad (1)$$

where $\mu_k=\mu_k/(\beta T_s/2)$. This additional normalization is necessary in order to normalize for the distance between the input samples.

There is one other case remaining—the case during which the NCO does not trigger. This happens when the samples are as in FIG. 5. Here again $\mu_k$ can be shown to be $\mu_k=(1-\mu)T_s$ and $\mu_k=\mu_k/(\beta T_s/2)$. Note however that the μ value must now correspond to that in the previous cycle. With this value of $\mu_k$ and the samples of the buffer, all three cases can be easily handled. This leads to the following algorithm for the NCO in the rate converter.

$$v(m+1) = v(m) - \frac{1}{\beta} \qquad (2)$$

$$\text{If } v(m+1)<0 \qquad (3)$$

$$v(m+1)=v(m+1)+1 \qquad (4)$$

$$\mu(m)=2\cdot v(m) \qquad (5)$$

$$\text{if } 1-\mu(m)>0 \qquad (6)$$

$$\mu_k=(1-\mu(m)) \qquad (7)$$

else (8)

$\mu_k = (2-\mu(m))$ (9)

end (10)

else (11)

$$\mu_k = \left(\frac{2}{\beta} - \mu(m)\right)$$ (12)

endif (13)

⋮ (14)

The above algorithm however requires that the NCO be decremented by $1/\beta$ which may not be representable using the desired number of bits resulting in sampling rate error. An alternative approach is to suffer an interpolation error i.e. sampling phase jitter instead of sampling rate error. Let $\tilde{v}(m) \triangleq \beta \cdot v(m)$; then, the above algorithm may be modified as follows:

$\tilde{v}(m+1) = \tilde{v}(m) - 1$ (15)

if $\tilde{v}(m+1) < 0$ (16)

$\tilde{v}(m+1) = \tilde{v}(m+1) + \beta$ (17)

$$\mu(m) = \frac{\tilde{v}(m)}{r}$$ (18)

if $1-\mu(m) > 0$ (19)

$\mu_k = (1-\mu(m))$ (20)

else (21)

$\mu_k = (2-\mu(m))$ (22)

end (23)

else (24)

$$\mu_k = \left(\frac{2}{\beta} - \mu(m)\right)$$ (25)

endif (26)

⋮ (27)

It is clear from the algorithm above that the NCO can precisely identify the samples between which to interpolate (provided that we are able to represent $\beta$ accurately using the desired number of bits). Hence, this algorithm leads to a phase jitter only and thus might be more preferable. In some applications, it is desirable to be able to express the rate conversion factor as a rational number i.e.

$$\beta = \frac{P}{Q}.$$

The above algorithm can then be modified as $\tilde{v}(m+1) = \tilde{v}(m) - Q$ (28)

if $\tilde{v}(m+1) < 0$ (29)

$\tilde{v}(m+1) = \tilde{v}(m+1) + P$ (30)

$$\mu(m) = \frac{2 \cdot \tilde{v}(m)}{P}$$ (31)

if $1-\mu(m) > 0$ (32)

$\mu_k = (1-\mu(m))$ (33)

else (34)

$\mu_k = (2-\mu(m))$ (35)

end (36)

else (37)

$$\mu_k = \left(\frac{2 \cdot Q}{P} - \mu(m)\right)$$ (38)

endif (39)

⋮ (40)

Figure 7:
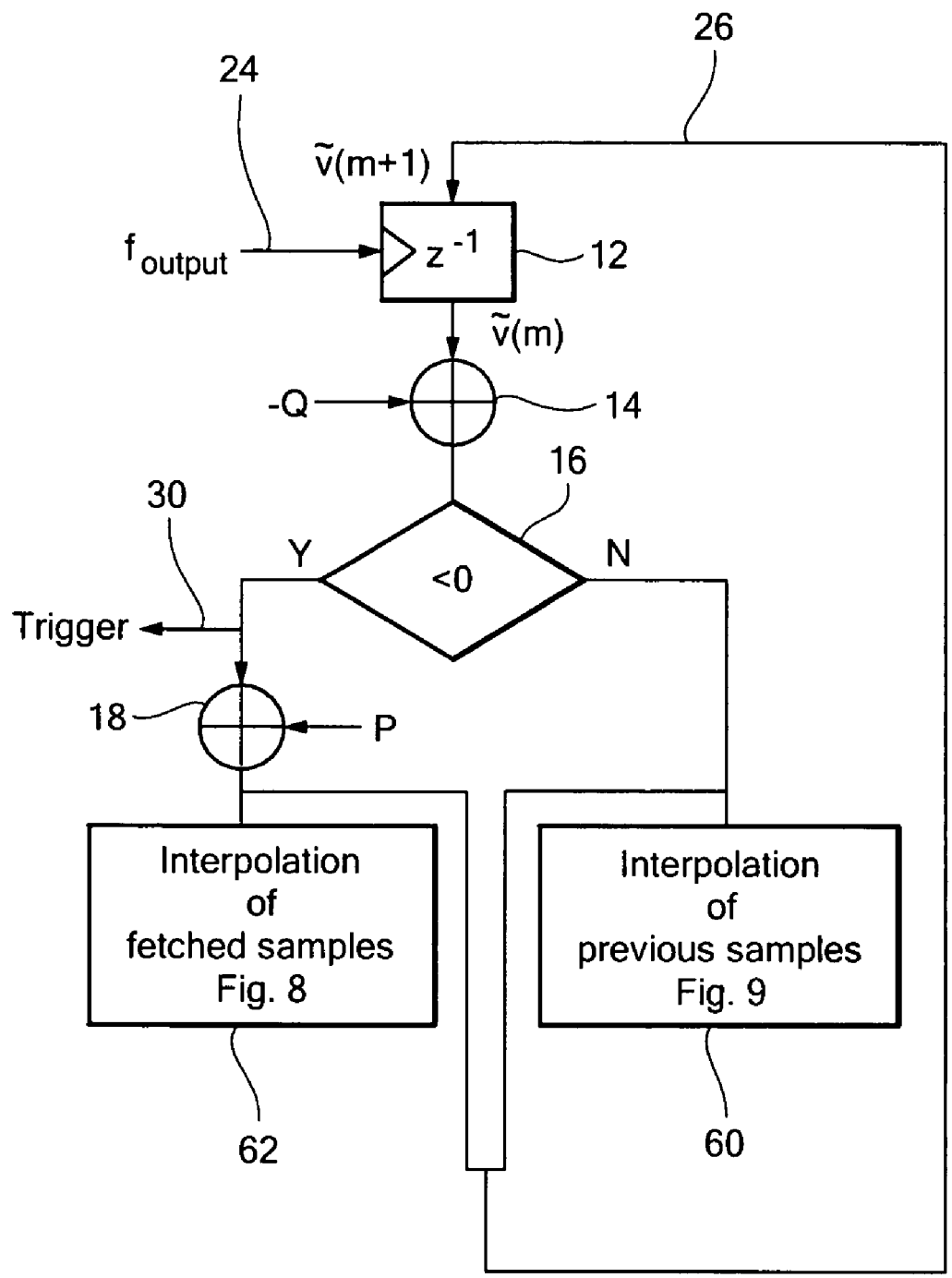
FIG. 7 is a schematic flow block diagram of the method of this invention.

The implementation of this algorithm is depicted in FIG. 7, where NCO register 12 receives as its clock input 24 the clock at output rate $f_{output}$. Register 12 is loaded on line 26 with the $\tilde{v}(m+1)$. The output of register 12 $\tilde{v}(m)$ is delivered to summing circuit 14 which responds to the factor $-Q$. Comparator 16 provides one output to the non triggering routine 60, its other output to summing circuit 18 and then routine 62. Summing circuit 18 responds to factor P.

Figure 8:
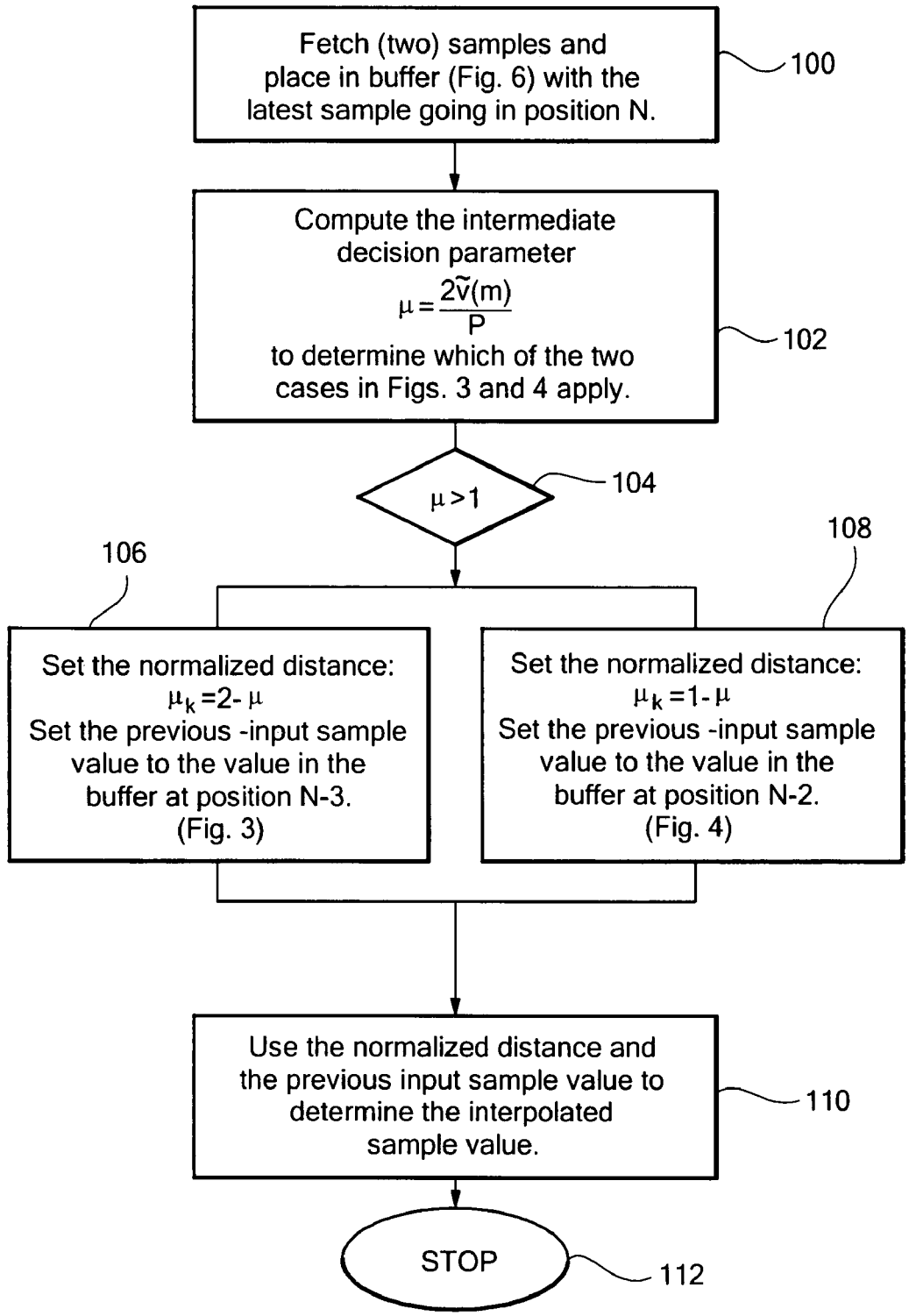
FIG. 8 is a schematic flow block diagram of the routine followed in FIG. 7 when the NCO provides a trigger.

Interpolation of fetched samples, FIG. 8, begins with fetching new samples, typically two new samples, and placing them in the buffer with the latest sample going in position N, step 100. Then the intermediate decision parameter $\mu = 2 \cdot \tilde{v}(m)/P$ (as in expression 31) is computed to determine which of the two cases in FIGS. 3 and 4 apply, step 102. If $\mu$ is larger than one, 104 then the normalized distance is set $\mu_k = 2-\mu$ and the previous input sample value is set to the value in the buffer at position N-3, 106. If $\mu$ is less than or equal to one, the normalized distance $\mu_k = 1-\mu$ is set and the previous input sample is set to the value in the buffer in position N-2, 108. Then the normalized distance and the previous input sample value are used to determine the interpolated sample value 110 and the routine stops 112.

Figure 9:
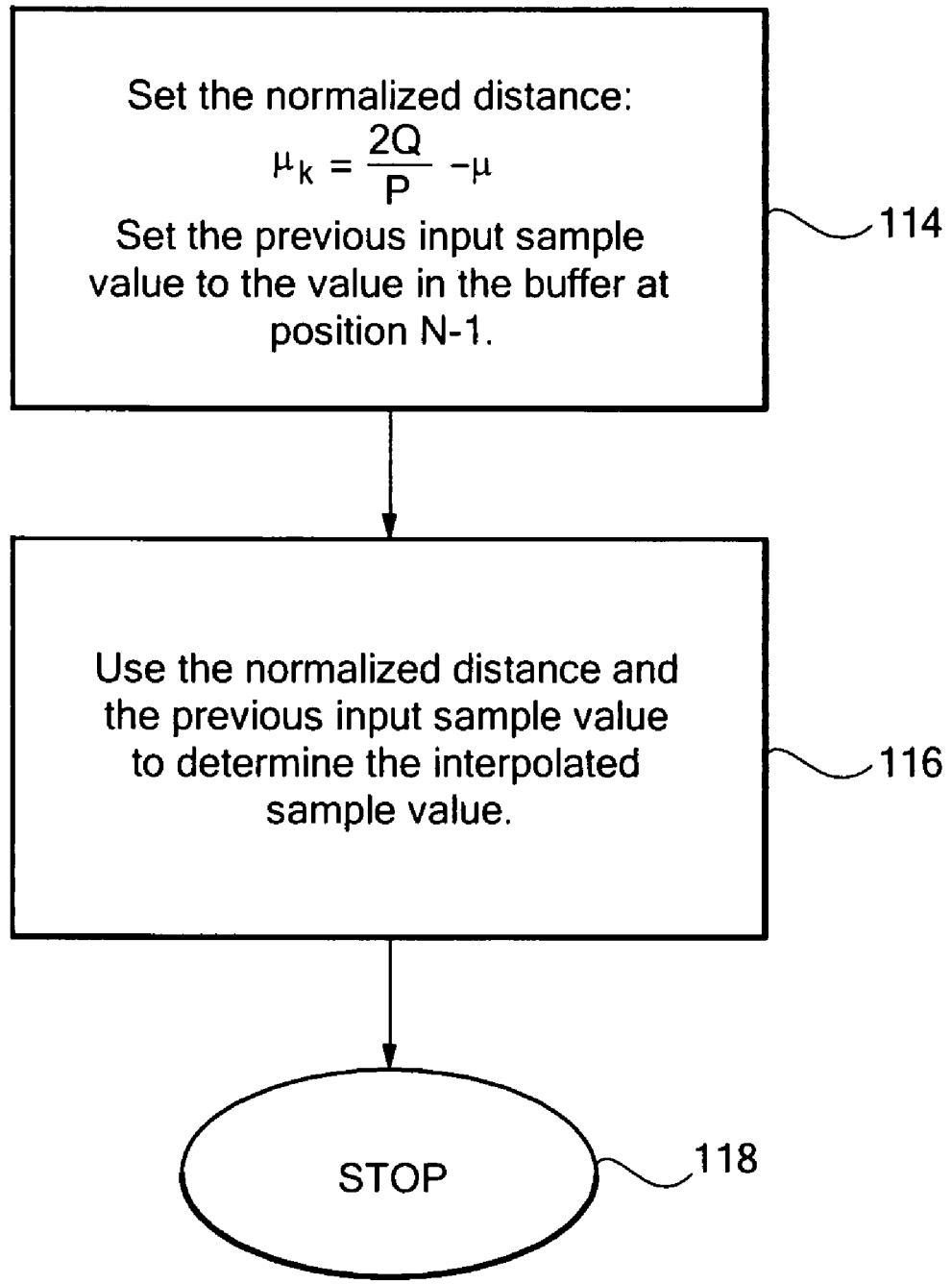
FIG. 9 is a schematic flow block diagram of the routine followed in FIG. 7 when the NCO does not provide a trigger.

Interpolation 60 is accomplished, FIG. 9, by setting the normalized distance $$\mu_k = \frac{2Q}{P} - \mu$$

and setting the previous sample value to the value in the buffer at position N-1, 114. Then using the normalized distance and the previous input sample value to determine the interpolated sample value, 116 and then stopping 118.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A sample rate converter system comprising:
   a numerically controlled oscillator (NCO) register for receiving a clock input at the desired output rate;
   a first summing circuit, responsive to a first factor to decrement said NCO register contents;
   a comparator for indicating when said decremented NCO register contents are at zero or below; and in response to the said decremented NCO register contents not being zero or below, presenting said decremented NCO register contents to the input of the said NCO register;
   a second summing circuit responsive to said decremented NCO register contents being zero or below to increment said decremented NCO register contents by a second factor and present it to the input of said NCO register; and
   a processor configured, in response to said decremented NCO register contents being zero or below, to fetch samples and interpolate them to produce a resultant sample value at the output rate, and in response to said contents not being zero or below to interpolate the previous sample to produce a resultant sample value.

2. The sample rate converter system of claim 1 in which the ratio of said first and second factors is the ratio of the input rate, to twice the output rate of said sample rate converter system.

3. The sample rate converter system of claim 1 in which the ratio of said first and second factors is between 0.5 and 1.0.

4. The sample rate converter system of claim 1 in which said second factor is one and said first factor is $1/\beta$, where $\beta$ is twice the rate conversion factor and where the rate conversion factor is the ratio of the output rate to the input rate.

5. The sample rate converter system of claim 1 in which said processor is further configured to interpolate, in response to said decremented NCO register contents being zero or below, said fetched samples by determining which of two sample patterns exist, setting the normalized distance and indexing the location of the previous sample value relative to other samples in a buffer for the determined sample pattern and from said normalized distance and at least two of said sample values in the buffer to calculate the interpolated sample value.

6. The sample rate converter system of claim 1 in which said processor is further configured, in response to said decremented NCO register contents being not zero or below, to set the normalized distance and index the location of the previous sample value relative to other sample values in a buffer and from the normalized distance and at least two sample values in the buffer, calculate the interpolated sample value.

7. A sample rate converter system comprising:
   a numerically controlled oscillator (NCO) register for receiving a clock input at the desired output rate;
   a first summing circuit, responsive to a first factor to increment said NCO register contents;
   a comparator for indicating when said incremented NCO register contents are at one or above; and in response to the said incremented NCO register contents not being one or above, presenting said incremented NCO register contents to the input of the said NCO register;
   a second summing circuit responsive to said incremented NCO register contents being one or above to decrement said incremented NCO register contents by a second factor and present it to the input of said NCO register; and
   a processor configured, in response to said incremented NCO register contents being one or above, to fetch samples and interpolate them to produce a resultant sample value at the output rate, and in response to said contents not being one or above to interpolate the previous sample to produce a resultant sample value.

8. The sample rate converter system of claim 7 in which the ratio of said first and second factors is the ratio of the input rate, to twice the output rate of said sample rate converter system.

9. The sample rate converter system of claim 7 in which the ratio of said first and second factors is between 0.5 and 1.0.

10. The sample rate converter system of claim 7 in which said second factor is one and said first factor is $1/\beta$, where $\beta$ is twice the rate conversion factor and where the rate conversion factor is the ratio of the output rate to the input rate.

11. The sample rate converter system of claim 7 in which said processor is further configured to interpolate, in response to said incremented NCO register contents being one or above, said fetched samples by determining which of two sample patterns exist, setting the normalized distance and indexing the location of the previous sample value relative to other samples in a buffer for the determined sample pattern and from said normalized distance and at least two of said sample values in the buffer to calculate the interpolated sample value.

12. The sample rate converter system of claim 7 in which said processor is further configured, in response to said incremented NCO register contents being not one or above, to set the normalized distance and index the location of the previous sample value relative to other sample values in a buffer and from the normalized distance and at least two sample values in the buffer, calculate the interpolated sample value.

13. A sample rate converter system comprising:
   a numerically controlled oscillator (NCO) register for receiving a clock input at the desired output rate;
   a first summing circuit, responsive to a first factor to first modify said NCO register contents;
   a comparator for indicating when said first modified NCO register contents are in a predetermined range; and in response to the said modified NCO register contents not being in the said predetermined range, presenting said first modified NCO register contents to the input of the said NCO register;
   a second summing circuit responsive to said first modified NCO register contents being in said predetermined range to second modify said first modified NCO register contents by a second factor and present it to the input of said NCO register; and a processor configured, in response to said first modified NCO register contents being in said predetermined range, to fetch samples and interpolate them to produce a resultant sample value at the output rate, and in response to said contents not being in said predetermined range to interpolate the previous sample to produce a resultant sample value.

14. The sample rate converter system of claim 13 in which the ratio of said first and second factors is the ratio of the input rate, to twice the output rate of said sample rate converter system.

15. The sample rate converter system of claim 13 in which the ratio of said first and second factors is between 0.5 and 1.0.

16. The sample rate converter system of claim 13 in which said second factor is one and said first factor is $1/\beta$, where $\beta$ is twice the rate conversion factor and where the rate conversion factor is the ratio of the output rate to the input rate.

17. The sample rate converter system of claim 13 in which said processor is further configured to interpolate, in response to said first modified NCO register contents being in said predetermined range, said fetched samples by determining which of two sample patterns exist, setting the normalized distance and indexing the location of the previous sample value relative to other samples in a buffer for the determined sample pattern and from said normalized distance and at least two of said sample values in the buffer to calculate the interpolated sample value.

18. The sample rate converter system of claim 13 in which said processor is further configured, in response to said first modified NCO register contents being not in said predetermined range, to set the normalized distance and index the location of the previous sample value relative to other sample values in a buffer and from the normalized distance and at least two sample values in the buffer, calculate the interpolated sample value.

19. A sample rate converter method comprising:
presenting to a numerically controlled oscillator (NCO) register a clock input at the desired output rate;
first-modifying said NCO register contents responsive to a first factor;
determining when said first modified NCO register contents are in a predetermined range; and in response to the said first modified NCO register contents not being in the said predetermined range, presenting said first modified NCO register contents to the input of the said NCO register;
second-modifying, responsive to a second factor, said first modified NCO register contents when said first modified NCO register contents are within said predetermined range and presenting it to the input of the NCO register; and
fetching samples, in response to said first-modified NCO register contents being in said predetermined range and interpolating them to produce a resultant sample value at the output rate, and in response to said contents not being in said predetermined range to interpolate the previous sample to produce a resultant sample value at the output rate.

20. The sample rate converter method of claim 19 in which the ratio of said first and second factors is the ratio of the input rate, to twice the output rate of said sample rate converter system.

21. The sample rate converter method of claim 19 in which the ratio of said first and second factors is between 0.5 and 1.0.

22. The sample rate converter method of claim 19 in which said second factor is one and said first factor is $1/\beta$, where $\beta$ is twice the rate conversion factor and where the rate conversion factor is the ratio of the output rate to the input rate.

23. The sample rate converter method of claim 19 in which interpolating includes in response to said first modified NCO register contents being in said predetermined range, determining which of two sample patterns exist, setting the normalized distance and indexing the location of the previous sample value relative to other samples in a buffer for the determined sample pattern and from said normalized distance and at least two of said sample values in the buffer to calculating the interpolated sample value.

24. The sample rate converter method of claim 19 in which interpolating, in response to said first modified NCO register contents being not in said predetermined range includes setting the normalized distance and indexing the location of the previous sample value relative to other sample values in a buffer and from the normalized distance and at least two sample values in the buffer, calculating the interpolated sample value.

25. A sample rate converter method comprising:
presenting to a numerically controlled oscillator (NCO) register a clock input at the desired output rate;
decrementing said NCO register contents responsive to a first factor;
determining when said decremented NCO register contents are in a predetermined range; and in response to said decremented NCO register contents not being in the said predetermined range, presenting said decremented NCO register contents to the input of the said NCO register;
incrementing, responsive to a second factor, said first decremented NCO register contents when said first decremented NCO register contents are zero or below and presenting it to the input of the NCO register; and
fetching samples, in response to said decremented NCO register contents being zero or below and interpolating them to produce a resultant sample value at the output rate, and in response to said contents not being zero or below to interpolate the previous sample to produce a resultant sample value at the output rate.

26. The sample rate converter method of claim 25 in which the ratio of said first and second factors is the ratio of the input rate, to twice the output rate of said sample rate converter system.

27. The sample rate converter method of claim 25 in which the ratio of said first and second factors is between 0.5 and 1.0.

28. The sample rate converter method of claim 25 in which said second factor is one and said first factor is $1/\beta$, where $\beta$ is twice the rate conversion factor and where the rate conversion factor is the ratio of the output rate to the input rate.

29. The sample rate converter method of claim 25 in which interpolating includes in response to said decremented NCO register contents being zero or below, determining which of two sample patterns exist, setting the normalized distance and indexing the location of the previous sample value relative to other samples in a buffer for the determined sample pattern and from said normalized distance and at least two of said sample values in the buffer to calculating the interpolated sample value.

30. The sample rate converter method of claim 25 in which interpolating, in response to said decremented NCO register contents being not zero or below includes setting the normalized distance and indexing the location of the previous sample value relative to other sample values in a buffer and from the normalized distance and at least two sample values in the buffer, calculating the interpolated sample value.

31. A sample rate converter method comprising:

presenting to a numerically controlled oscillator (NCO) register a clock input at the desired output rate;

incrementing said NCO register contents responsive to a first factor;

determining when said incremented NCO register contents are one or above; and in response to the said incremented NCO register contents not being one or above, presenting said incremented NCO register contents to the input of the said NCO register;

decrementing, responsive to a second factor, said first modified NCO register contents when said incremented NCO register contents are one or above and presenting it to the input of the NCO register; and fetching samples, in response to said incremented NCO register contents being one or above and interpolating them to produce a resultant sample value at the output rate, and in response to said contents not being one or above to interpolate the previous sample to produce a resultant sample value at the output rate.

32. The sample rate converter method of claim 31 in which the ratio of said first and second factors is the ratio of the input rate, to twice the output rate of said sample rate converter system.

33. The sample rate converter method of claim 31 in which the ratio of said first and second factors is between 0.5 and 1.0.

34. The sample rate converter method of claim 31 in which said second factor is one and said first factor is $1/\beta$, where $\beta$ is twice the rate conversion factor and where the rate conversion factor is the ratio of the output rate to the input rate.

35. The sample rate converter method of claim 31 in which interpolating includes in response to said incremented NCO register contents being one or above, determining which of two sample patterns exist, setting the normalized distance and indexing the location of the previous sample value relative to other samples in a buffer for the determined sample pattern and from said normalized distance and at least two of said sample values in the buffer to calculating the interpolated sample value.

36. The sample rate converter method of claim 31 in which interpolating, in response to said incremented NCO register contents being not one or above includes setting the normalized distance and indexing the location of the previous sample value relative to other sample values in a buffer and from the normalized distance and at least two sample values in the buffer, calculating the interpolated sample value.

* * * * *